United States Patent [19]

Wilson et al.

[11] Patent Number: 5,323,337
[45] Date of Patent: Jun. 21, 1994

[54] SIGNAL DETECTOR EMPLOYING MEAN ENERGY AND VARIANCE OF ENERGY CONTENT COMPARISON FOR NOISE DETECTION

[75] Inventors: Dennis L. Wilson, Palo Alto; James L. Wayman, Pebble Beach, both of Calif.

[73] Assignee: Loral Aerospace Corp., New York, N.Y.

[21] Appl. No.: 925,083

[22] Filed: Aug. 4, 1992

[51] Int. Cl.$^5$ .............................................. H04B 17/00
[52] U.S. Cl. .................................... 364/574; 364/572; 364/576; 364/485; 381/46; 395/2
[58] Field of Search .............. 364/500, 508, 572, 574, 364/576, 485; 381/46; 395/2; 353/12

[56] References Cited

U.S. PATENT DOCUMENTS

| | | | |
|---|---|---|---|
| 4,052,568 | 10/1977 | Jankowski | 179/15 |
| 4,667,065 | 5/1987 | Bangerter | 379/351 |
| 4,682,361 | 7/1987 | Selbach et al. | 381/46 |
| 4,696,039 | 9/1987 | Doddington | 381/46 |
| 4,829,578 | 5/1989 | Roberts | 395/2 |
| 4,860,359 | 8/1989 | Eicher | 381/46 |
| 4,882,755 | 11/1989 | Yamada et al. | 395/2 |
| 4,920,568 | 4/1990 | Kamiya et al. | 381/46 |
| 4,926,484 | 5/1990 | Nakano | 381/56 |
| 4,926,488 | 5/1990 | Nadas et al. | 381/41 |
| 4,982,341 | 1/1991 | Laurent | 381/46 |
| 5,035,859 | 10/1991 | Lucas | 358/12 |
| 5,103,481 | 4/1992 | Iseda et al. | 381/46 |
| 5,197,113 | 3/1993 | Mumolo | 395/2 |
| 5,210,820 | 5/1993 | Kenyon | 395/2 |
| 5,212,764 | 5/1993 | Ariyoshi | 395/2 |

FOREIGN PATENT DOCUMENTS

| | | | |
|---|---|---|---|
| 0487307 | 5/1992 | European Pat. Off. | 381/46 |
| 2239971 | 7/1991 | United Kingdom | 381/46 |

Primary Examiner—Jack B. Harvey
Assistant Examiner—Hal D. Wachsman
Attorney, Agent, or Firm—Perman & Green

[57] ABSTRACT

A signal detector discriminates between signals manifesting noise and signals manifesting information, both of which appear at an input. A analog-to-digital converter circuit samples the signals and a Fourier filter determines, for each signal sample, energy content of each of a plurality of frequency cells in the sample. A processor then determines the mean energy content and the average variance of energy content in all frequency cells in the signal sample. The mean energy content and average variance of energy content of the signal sample are then compared, and if the comparison indicates an approximate equality, the sample is declared to be noise. The processor further determines a centroid center frequency for the frequency cells in the sample which indicates, if it is on-center, that the sample is likely to be noise. The processor further determines the bandwidth of the Fourier components of the input signal, to determine if it is indicative of noise. The skew of the sample's Fourier components is also determined and if it is nearly zero (indicating the signal is symmetrical in frequency about the center frequency), a noise signal is indicated. The combined indications are then normalized and subjected to a threshold which indicates whether a signal or noise is present.

11 Claims, 4 Drawing Sheets

SIGNAL DETECTOR EMPLOYING MEAN ENERGY AND VARIANCE OF ENERGY CONTENT COMPARISON FOR NOISE DETECTION

FIELD OF THE INVENTION

This invention relates to signal detectors, and more particularly, to a signal detector that rapidly distinguishes a signal from surrounding noise.

BACKGROUND OF THE INVENTION

Prior art signal detectors exhibit a number of drawbacks. They are slow to act, have high false alarm rates, and miss some signals at relatively high signal-to-noise ratios. Many signal detectors compare the energy of the signal with a threshold. The signal energy is measured, approximately, with an envelope detector, or more directly using the signal itself, but for such a technique to be successful, the threshold level must be known. If the noise level changes, the performance of the detector can be degraded unless the threshold or preamplifier gain is changed to accommodate the changed circumstances. One solution to the noise change affect is to include a noise-riding threshold in the signal detector. This is accomplished by basing the threshold on a noise level that was measured some short time in the past.

Certain signals such as modem signals have a constant energy and will cause a threshold to adjust and the signal to drop below the threshold in a time comparable to the time constant of the change of the threshold. Such signals will be lost after a short time in a noise-riding threshold detector.

FM radio systems employ a detection scheme that captures a signal for detection by a "hard limiter". A hard limiter exhibits a constant power output. If a narrow band signal is received in the bandwidth of a hard limiter, most of the energy of the output will be at the frequency of the narrow band signal. The result is that the energy away from the frequency of the signal is suppressed by the "capture" effect. By providing filters that measure the energy away from the frequencies where signals are expected, suppression of hard limiter noise can be achieved. Hard limiter detectors, however, exhibit limited performance and lack of applicability to digital signals. When the time constant of the detector is short, there tends also, to be too many false alarms.

Other signal detectors employ non-parametric statistical approaches. One approach is to collect a set of samples from an input signal. The next step adjusts the signal amplitudes to have a sample mean of absolute signal values that equals a constant value (e.g., 1.0). The set of numbers that results is tested for a match to a particular distribution. One test is to rank order the samples, (i.e., arrange them in the order of their amplitudes) and then to check the difference between the 10% and 90% values. If this value changes significantly from a value when there is only noise present, a signal has been detected. This approach is difficult to implement as the process of rank-ordering a collection of samples is time consuming. If the signal is only checked at intermittent intervals, the sorting process, while slow, enables a reliable detection scheme. However, if the signal is subject to rapid changes of state, the detection procedure deteriorates rapidly.

A variety of additional signal detection schemes are described in the following prior art. U.S. Pat. No. 4,052,568 to Jankowski, entitled "Digital Voice Switch" describes the use of a set of adaptive thresholds to detect a voice signal. A plurality of thresholds are used to enable reliable detection in a short time. U.S. Pat. No. 4,667,065 to Bangetter, entitled "Apparatus and Methods For Electrical Signal Discrimination" analyzes a pattern of threshold crossings of a signal to determine whether the signal is a voice signal or some other signal with a more periodic nature. Noise is excluded by setting the basic detection threshold so that the noise does not cross the threshold. The Bangerter system primarily discriminates voice signals from other signals with the noise discrimination occurring as a result of a threshold setting.

U.S. Pat. No. 4,682,361 to Selbach et al., entitled "Method of Recognizing Speech Pauses" employs a Fourier transform to form the spectrum of a received signal. The spectrum is used to estimate signal power and noise power. When the signal power is above a noise power threshold, a signal is declared to be present.

U.S. Pat. No. 4,696,039 to Doddington, entitled "Speech Analysis/Synthesis System with Silence Suppression" estimates the level of peaks and valleys of a signal envelope and declares a signal to be present when a peak is sufficiently larger than a valley. Envelope peaks are determined by a fast rise, slow fall signal detector, and valleys are estimated by employing a slow rise, fast fall signal detector. The system described by Doddington is essentially an adaptive threshold detector.

U.S. Pat. No. 4,829,578 to Roberts, entitled "Speech Detection and Recognition Apparatus For Use With Background Noise of Varying Levels" estimates the noise level of a signal by using an adaption technique during the period before a "start of speech" and after an "end of speech". When the amplitude crosses a level based on the estimate of the noise level, the voice signal is declared to be present.

U.S. Pat. No. 4,860,359 to Eicher, entitled "Method Of Voice Operated Transmit Control" describes a computer program that performs a number of control operations involved with the operation of a push-to-talk transceiver. A voice signal detection scheme employs a set of four filters. The amplitudes of signals from the filters are compared to detect a received voice signal.

U.S. Pat. No. 4,920,568 to Kamiya et al., entitled "Method of Distinguishing Voice From Noise" is a system for detecting voiced sounds in noise. The system employs the power in the signal over an interval and the values of linear predictive filter coefficients to detect the voice signal. Whenever both the power and the sum of the filter coefficients is larger than their respective thresholds, the signal is likely to be a voice signal.

U.S. Pat. No. 4,926,484 to Nakano, entitled "Circuit For Determining That an Audio Signal is Either Speech or Non-Speech", detects a voice signal by making use of the fact that the voice signal has gaps. The gain of a detector preceding a detection threshold is adjusted up or down (effectively adjusting the threshold) in dependence on the relative amount of time that the incoming signal amplitude spends above and below a threshold. If the signal spends too much time below the threshold, the gain is increased. If the signal spends too much time above the threshold, the gain is reduced.

U.S. Pat. No. 4,926,488 to Nadas et al, entitled "Normalization of Speech by Adaptive Labeling" employs a vector quantizing scheme, with vectors being modified slowly in an adaptive manner. The incoming signal is detected only by the amount of energy within the signal within a time period.

U.S. Pat. No. 4,982,341 to Laurent, entitled "Method and Device for the Detection of Local Signals" teaches the use of the ratio of the power in a signal and the power in a high pass filtered version of the signal to detect a voice signal. Voiced signals tend to have the power in the low frequencies and the relative power at high frequencies is small. When the power of the two signals is approximately the same, the signal is assumed to be noise.

The procedures described in the above cited prior art are, in many instances, adaptive and time consuming in their performance. Of those that teach spectrum analysis, the use of the spectrum is employed to measure the energy in the signal. Generally, they also check to see if a particular kind of signal is present in the input.

Accordingly, it is an object of this invention to provide a signal detector that detects the presence of noise rather than an information signal.

It is another object of this invention to provide a signal detector that is non-adaptive and, as a result, exhibits extreme rapidity in its detection capability.

It is yet another object of this invention to provide a signal detector that provides a plurality of independent indicators of the presence of a noise signal, so as to achieve a low false alarm rate.

SUMMARY OF THE INVENTION

A signal detector discriminates between signals manifesting noise and signals manifesting information, both of which appear at an input. An analog-to-digital converter circuit samples the signals and a Fourier transform determines, for each signal sample, energy content of each of a plurality of frequency cells in the sample. A processor then determines the mean energy content and the variance of energy content across all frequency cells in the signal sample. The mean energy content and variance of energy content of the signal sample are then compared, and if the comparison indicates an approximate equality, the sample is declared to be noise. The processor further determines the centroid in frequency of the signal spectrum which indicates, if it is on-center, that the sample is likely to be noise. The processor further determines the bandwidth of the Fourier components of the input signal, to determine if it is indicative of noise. The skew of the sample's Fourier components is also determined and if it is nearly zero (indicating the signal is symmetrical about the centroid in frequency), a noise signal is indicated. The combined indications are then normalized, combined and subjected to a fixed threshold which indicates whether a signal or noise is present.

DETAILED DESCRIPTION OF THE INVENTION

Figure 1:
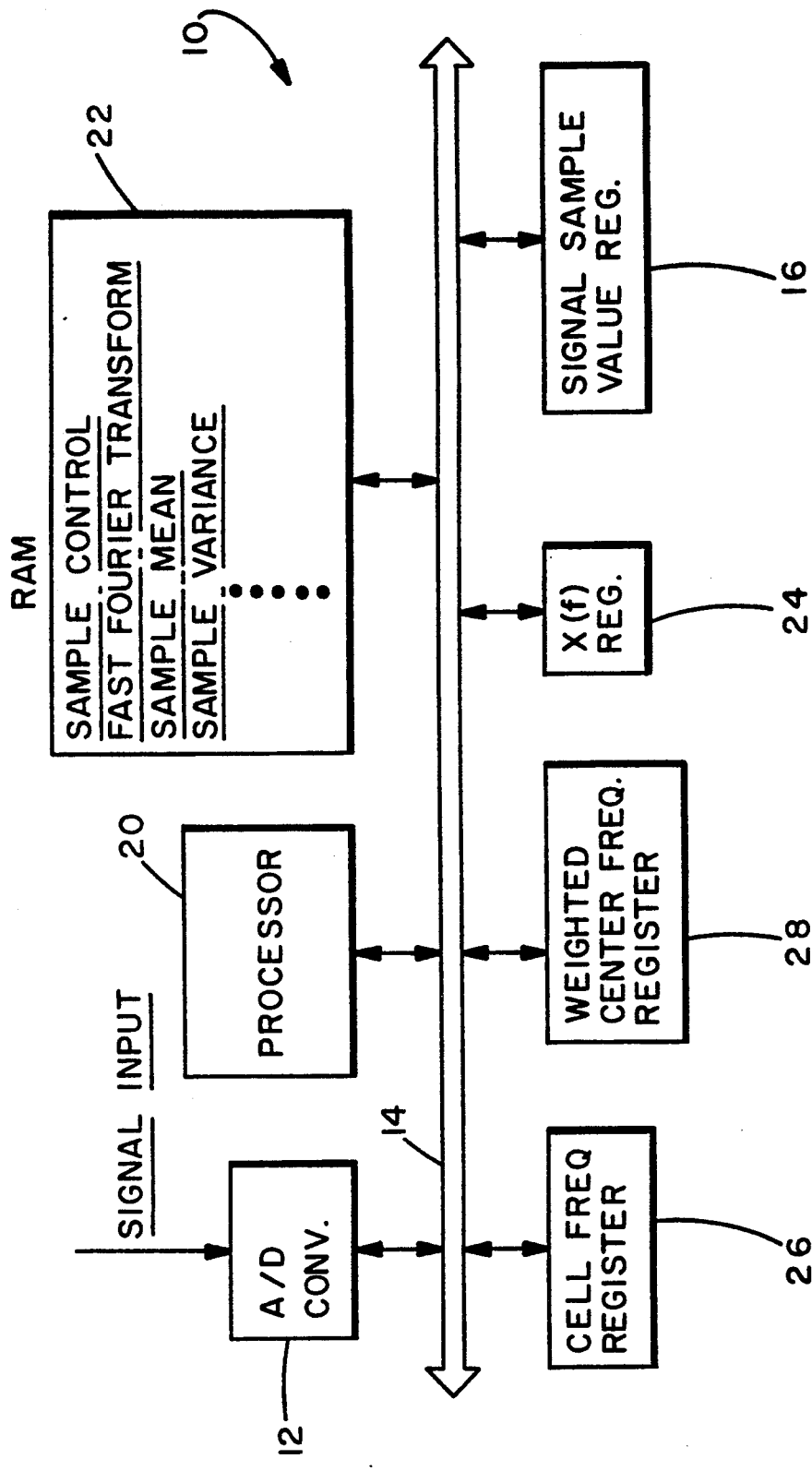
FIG. 1 is a high level block diagram of a data processing system for performing the invention.

Referring to FIG. 1, a block diagram illustrates the major components of a data processing system that performs the invention. It is also to be understood, that while individual registers, etc., are shown for holding data employed in the signal detection procedure, that such registers are shown for explanatory purposes, and that data stored therein could equally well be stored elsewhere in the system. Furthermore, the system will be described in context of detection of a voice signal in a 4000 Hz bandwidth. Those skilled in the art will recognize that the invention is equally applicable to other types of signals having greater or lesser bandwidth characteristics.

Data processing system 10 receives a signal input via analog-to-digital converter 12. There, the input signal is periodically sampled, converted to digital values, transferred to bus 14, and then input to signal sample value register 16. The sample rate is assumed to be 8000 Hz. A processor 20 controls the overall operation of data processing system 10 in conjunction with software stored in random access memory (RAM) 22.

RAM 22 contains, among others, the following software modules: a sample control procedure for operating A/D convertor 12 at a desired rate and for enabling the converted data to be stored in signal sample value register 16; a fast Fourier transform procedure for analyzing each signal sample and providing a plurality of values $|X(f)|^2$, each value indicative of the magnitude of a frequency component ("cell") of the signal sample; a "sample mean" procedure which determines an average of the values of $|X(f)|^2$ across the signal sample frequency cells; and a sample variance procedure which determines the variability of the values of $|X(f)|^2$ across the frequency cells of the signal sample.

Those software procedures enable storage in $|X(f)|^2$ register 24 of the magnitudes of the energy in the individual Fourier components of the signal sample. Those values are coupled with values stored in register 26 that are the center frequencies of the frequency cells. A center frequency register 28 is employed to store a frequency value for the frequency cells of an analyzed signal sample. That frequency value is the centroid in frequency of the signal spectrum. Further details regarding the derivation of the centroid center frequency (hereafter "cfc") will be discussed below.

Figure 2:
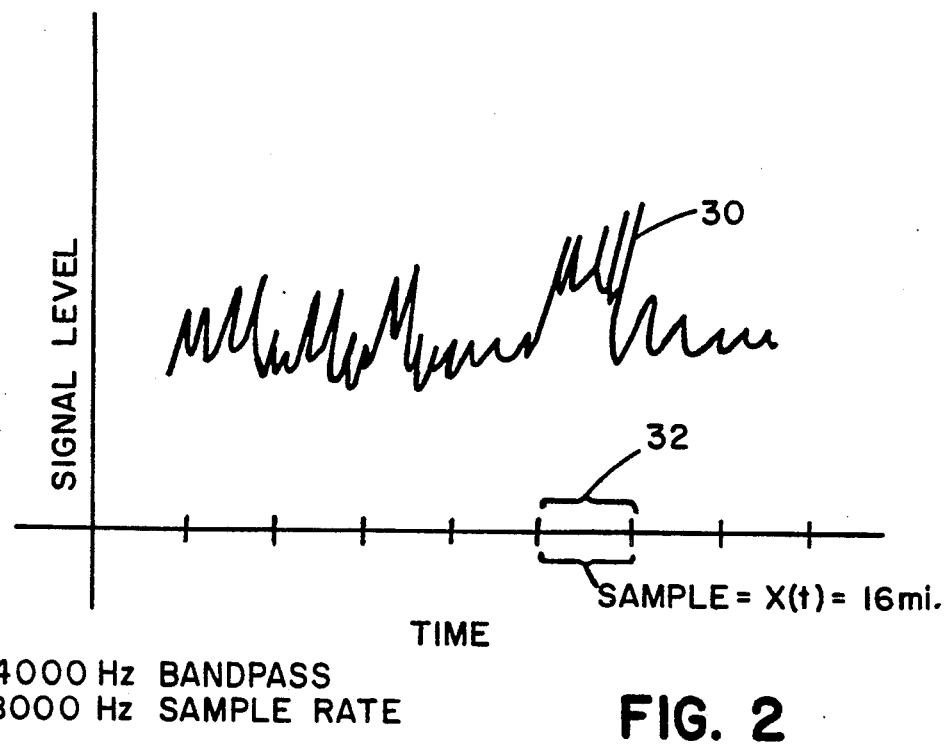
FIG. 2 is a plot of signal level versus time, illustrating a time sample of an input signal.
Figure 3:
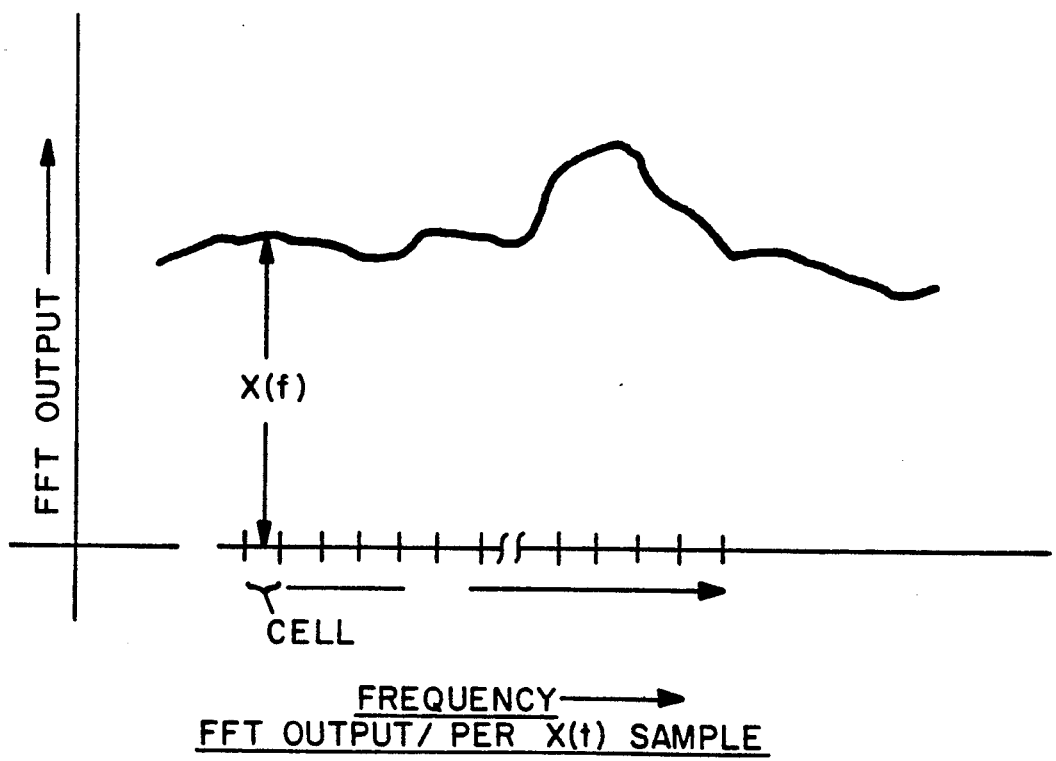
FIG. 3 is a a plot of an output of a fast Fourier transform of a sampled signal versus frequency, showing frequency cells derived from the input signal sample by the transform action.

Turning to FIG. 2, a plot shows an analog input signal 30 and a sample time interval 32. Within that sample time interval, A/D convertor 12 provides a number of samples sufficient for reliable operation (e.g., more than approximately 100 samples) of input signal magnitude to signal sample value register 16. Assuming an 8000 Hz sample rate, approximately 16 ms are taken in deriving those samples.

Once the digital signal samples are stored in register 16, the block of samples is subjected to a fast Fourier transform (or other equivalent frequency analysis) to determine respective energy contents across a plurality of frequency cells within the sample. The output of the fast Fourier transform procedure is a set of complex numbers, one complex number for each frequency whose energy is being measured. Hereafter, each such frequency will be referred to as a "cell", with there being "n" such cells (equal to one half the number of samples in the time block) provided by the fast Fourier transform function for each signal sample in register 16. For each cell, the squared magnitude of the complex number will be formed and stored in register 24. As a result, $|X(f)|^2$ register 24 will contain "n" numbers, each such number representing the energy at a cell frequency. Those cell frequencies are stored in cell frequency register 26.

To determine the presence of noise in the signal input, the system of FIG. 1 employs several statistical computations on the stored cell squared magnitudes $|X(f)|^2$ in register 24. The first computation derives a "sample variance" over the cell values, and the second computation derives a sample mean for the cell values. The sample mean is the average value of all Fourier cell squared magnitudes in a sample. It is preferred to use squared values of the Fourier cell magnitudes, as those values are indicative of the power within each frequency cell. For that reason, hereafter, "sample mean" will mean the average value of the Fourier cell absolute amplitude, squared. That value is given by $|X(f)|^2$.

In statistics, it is known that the "coefficient of variation" (hereafter designated Y) is the ratio of the standard deviation to the mean. It has been determined that the coefficient variation Y can be applied to determining whether an input signal is or is not noise. The use of this statistic is based upon the fact that the Fourier transform coefficients of uncorrelated white noise are independent random variables with a mean equal to the standard deviation. The square of the standard deviation is easier to calculate than the standard deviation so the variance is used in place of the standard deviation.

In accordance with the above, a sample mean for $|X(f)|^2$ is computed as shown by equation A below:

$$\text{Sample Mean } |X(f)|^2 = 1/n \sum_{1}^{n} |X(f)|^2 \tag{A}$$

Sample variance for the values of $|X(f)|^2$ across, the Fourier cells of the sampled input is computed as shown in equation B below.

$$\text{Sample Variance} = \frac{1}{n-1} \sum_{0}^{n} (|X(f)|^2 - \text{Sample mean } |X(f)|^2)^2 \tag{B}$$

The square of the Coefficient of Variation $Y^2$ is then computed as shown in equation C below.

$$Y^2 = \frac{\text{sample variance } |X(f)|^2}{(\text{sample mean } |X(f)|^2)^2} \tag{C}$$

If the input signal is white noise, the value of Y will be approximately unity. If the input is a signal, the value of $Y^2$ will likely be a value other than unity. Of course, if $Y^2$ is close to unity, then Y is also close to unity. It is to be noted that the use of the ratio shown in equation C eliminates any dependence upon a previous computation of the signal power in each cell. As a result, the value is independent of system gain or signal magnitude and is immediately available, requiring no training or other preparation time. The coefficient of variation $Y^2$ for a sample thus becomes an excellent means for detecting the presence of noise or a change from noise to an information signal.

The noise need not be Gaussian noise, only uncorrelated. If the input signal is not Gaussian noise but some other noise amplitude distribution characteristic, the sample mean will still have a value that is the same as the variance. There will be no change since the Fourier transform is, in effect, an average over a large number of identically distributed variables. The law of large numbers from statistics suggests that the result will be the same over a large range of probability distributions besides Gaussian random variables, as long as the number of Fourier transform coefficients used is large, i.e., more than about 10.

The above description has indicated that the ratio of the variance to the mean of the Fourier cell squared magnitudes is a measure of an input signal than can indicate the presence of noise or an information signal. Higher order values of the spectrum are also available and provide indications of the presence of noise. These higher order values measure the signal sample's center frequency, its bandwidth, its skew and even higher order statistics of the signal.

Concurrent with the computation of the mean to variance ratio, a centroid center frequency (cfc) across all frequency cells for a signal sample may be computed. The cfc is essentially the frequency wherein approximately equal energy resides in the sample's Fourier cells on both its upper and lower frequency sides. The cfc frequency is found by determining the centroid of the spectrum in frequency. If the cfc is approximately centered in the band of frequency cells produced by the Fourier analysis, it is assumed that the signal is noise, as the center frequency of noise will be the center of the bandwidth. The value of cfc can be computed as shown in equation D below.

$$cfc = \frac{\sum_{f=0}^{n} (f)(|X(f)|^2)}{\sum_{f=0}^{n} |X(f)|^2} \tag{D}$$

A second order independent statistic may also be computed to determine the bandwidth of Fourier cell magnitudes derived from a signal sample. That bandwidth is determined as shown in Equation E below:

$$\text{Bandwidth} = \text{Square root} \left( \frac{\sum_{f=0}^{n} (f - cfc)^2 (|X(f)|^2)}{\sum_{f=0}^{n} |X(f)|^2} \right) \tag{E}$$

The bandwidth is the second moment of the spectrum about the center frequency. The bandwidth as defined by equation E will, for noise, be the RMS value of a uniform distribution over the band, starting at zero and going to the Nyquist frequency and will equal $1/\sqrt{12}$ times the Nyquist frequency, independent of system gain.

A third order statistic, i.e., skew, may also be computed as indicated in equation F below:

$$\text{Skew} = \text{Cube root} \left( \frac{\sum_{f=0}^{n} (f - cfc)^3 (|X(f)|^2)}{\sum_{f=0}^{n} |X(f)|^2} \right) \tag{F}$$

The skew is the third moment of the spectrum about the center frequency. Skew is a measure of how unsymmetrical is the spectrum in relation to the center frequency. For noise, the skew will be approximately zero, since a noise signal is completely symmetrical.

Figure 4:
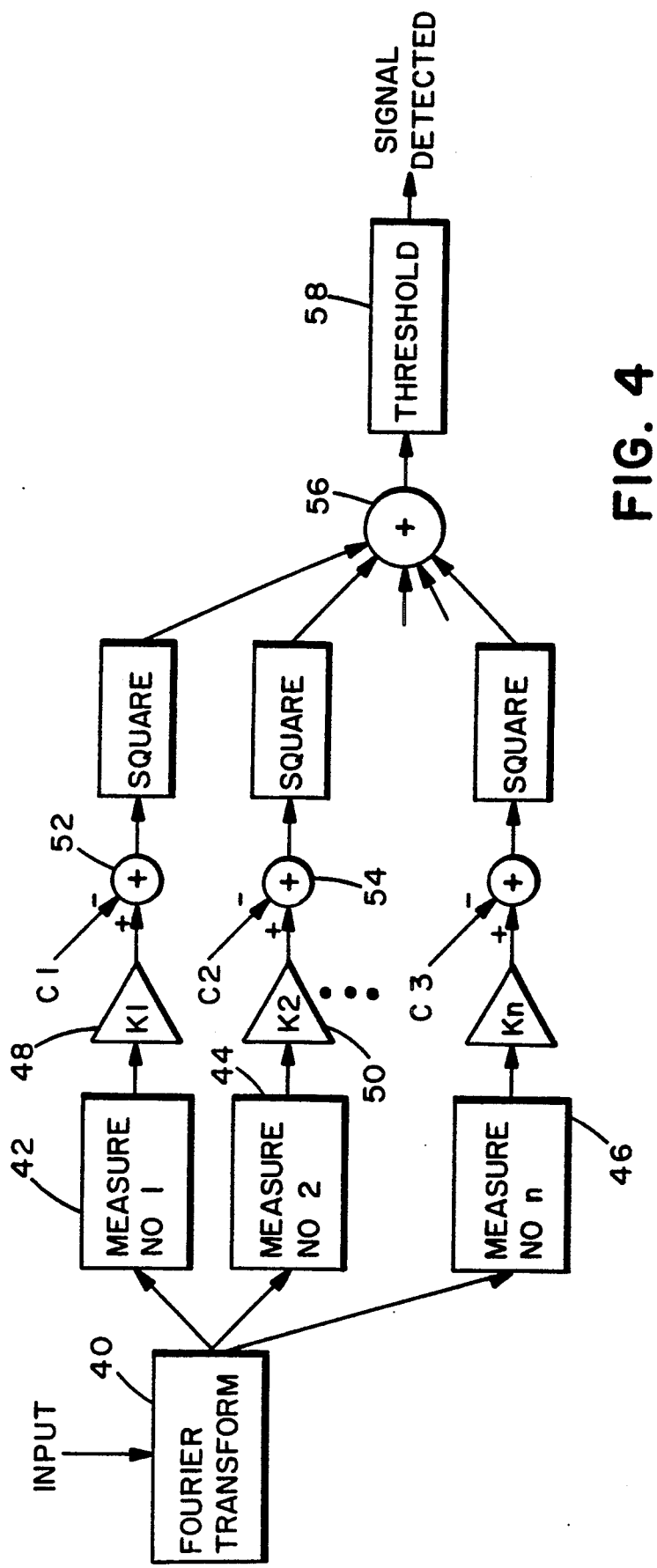
FIG. 4 is a flow/block diagram illustrating functions performed by the data processing system of FIG. 1 to enable the character of an input signal to be identified.

Referring now to FIG. 4, a flow diagram indicates the procedures performed by data processing system 10 (FIG. 1) in the performance of the noise detection procedure described above. As above stated, the signal input is sampled and subjected to a Fourier transform 40. The output of Fourier transform 40 is a plurality of Fourier cell squared magnitudes for each sample of the input signal. Those Fourier cell squared magnitudes are subjected to a number of procedures in measure modules 42, 44, 46 etc. For instance, measure module 42 performs the computation of the coefficient of variation as indicated by equation C; measure module 44 performs the computation indicated by equation D to determine the cfc, etc. Additional modules for higher order statistics may also be provided; however, it is to be understood that the inclusion of higher order computations may or may not be necessary depending upon the performance of the outputs of the more fundamental measure modules 42, 44, etc.

The output of each measure module is applied to a normalizing amplifier, e.g., 48, 50 etc. Each normalizing amplifier is adjusted so that the variation of the output of each measure module is the same, given a nominal white noise input. Thus, each amplifier 48, 50, etc. digitally modifies the output of its respectively connected measuring module to provide a statistical measure, with a nominal standard deviation, (e.g., a standard deviation of "1" in the presence of white noise).

The standard deviation of a measure can be determined with a noise input by collecting samples of the output of the measure for a short time and determining the standard deviation.

Each nominal output value from an amplifier is applied to a summer (e.g., 52, 54), another input of which is a constant, C1, C2. Assuming that measure module 42 derives the coefficient variation Y, the value of C1 will have a value of "1" multiplied by the gain of amplifier 48 so that the output of summer 52 is zero in the presence of noise. Similarly, assuming that measure module 44 determines cfc for the sample's Fourier cell amplitudes, the value of C2 is set equal to the center frequency of the n Fourier cells. Thus if the bandwidth of the n Fourier cells is 4,000 Hz, the value of c2 is set to a value equivalent to 2,000 Hz so that the result from summer 54 is zero in the event of white noise. It will be recalled that cfc for white noise produces a center frequency of 2,000 Hz.

The outputs from each of summers 52, 54, etc. are squared to emphasize any variation from the zero value and applied to a summer 56. The output from master summer 56 is applied to a threshold circuit 58 which provides an output indicative of an information signal in the event the output from summer 56 exceeds its stored threshold value.

It is to be understood that the threshold value used in the detection is independent of the gain of the system. Further it is to be understood that the threshold values are to be set to provide a given false alarm rate. In this manner the detector operates on one sample spectrum with n samples to detect the departure from noise independent of the amplitude of the signal at any time before or after the signal samples are collected for the Fourier transform and independent of the type of signal being detected.

It is further to be understood that the detector can operate with any combination of the measurements (from one of them to all of them). The threshold is to be adjusted, depending on the number of measurements that are combined. The measurements are independent, each providing a measure of the departure of the signal from noise in a different way. Thus the combination of the measurements will provide a more sure indication that an information signal is a departure from noise.

Figure 5:
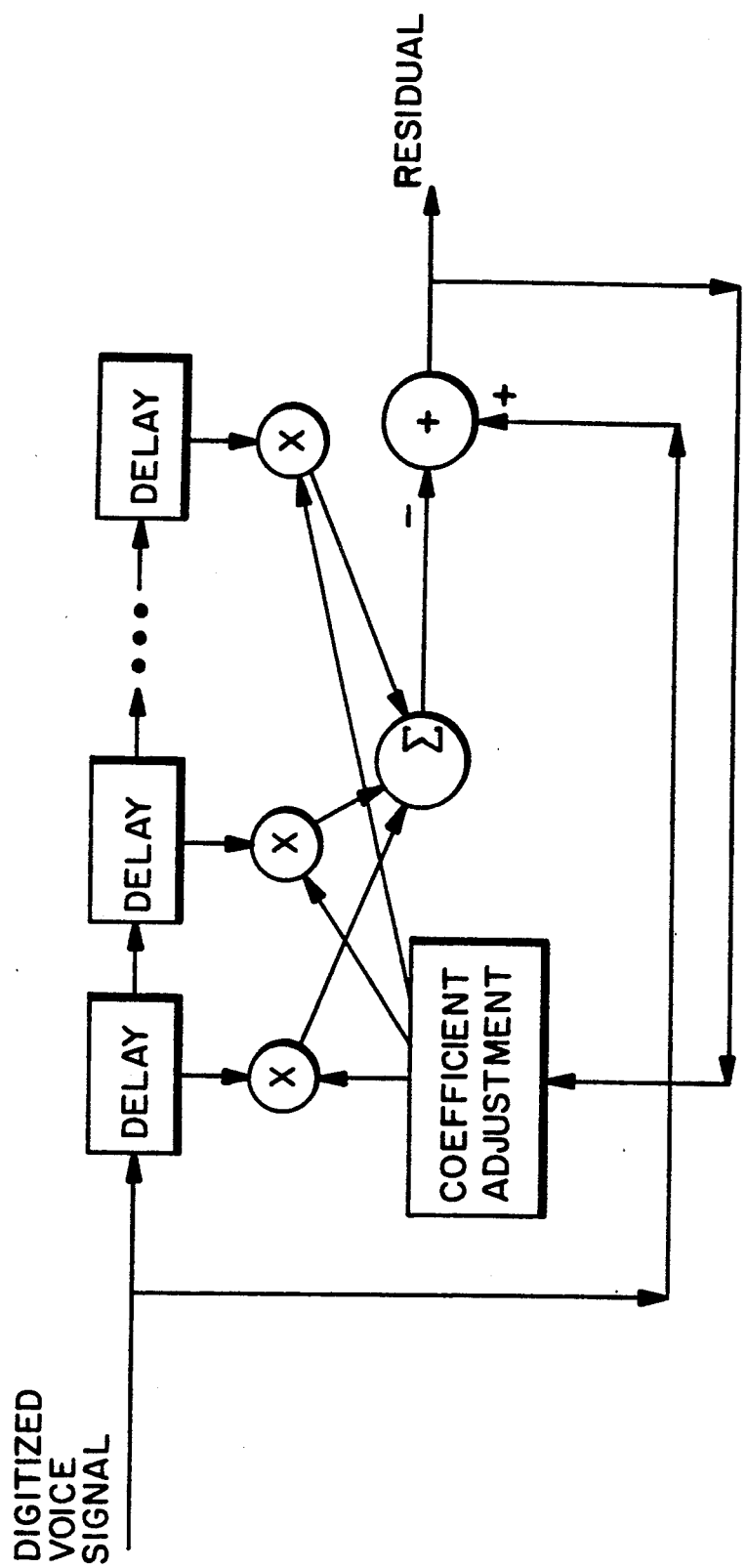
FIG. 5 is a block diagram showing a modification to the invention which enables interfering correlated signals to be eliminated before the detection process is performed.

The detector, as above described, will detect interfering correlated signals. A primary example of such a signal is a 60 cycle hum. Unless the hum is filtered out before the detection process proceeds, the detector will correctly declare there to be a signal present, i.e., the 60 cycle hum. In FIG. 5, an adaptive linear predictive filter is illustrated that enables the detector to operate in the presence of noise such as a 60 cycle hum. The output of the filter is a residual signal after removal of correlated noise from the signal. The time constant of the filter adaptation is set to be very slow, on the order of 1 to 10 seconds. The signals conveying information are correlated over times that are short compared to this time. As a result, the filter does not follow rapidly changing information signals, but filters the signals that change slowly (such as 60 cycle hum or motor noise from a vehicle). The frequencies occupied by the slowly varying tone are thus attenuated and are not present in the filter's residual signal. All remaining frequencies are present and signal energy outside of the tone frequencies can be detected. The residual output of the filter shown in FIG. 5 is applied as the input to fast Fourier analysis procedure shown in FIG. 1.

Let it be understood that the foregoing description is only illustrative of the invention. Various alternatives and modifications can be devised by those skilled in the art without departing from the spirit of the invention. Accordingly, the present invention is intended to embrace all such alternatives, modifications and variances which fall within the scope of the appended claims.

What is claimed is:

1. A signal detector for discriminating between signals manifesting noise and signals manifesting information appearing at an input, said signal detector comprising:
    means for sampling said signals at said input;
    filter means for determining for each signal sample, energy content of each of a plurality of frequency cells in said signal sample; and
    processor means for determining the mean energy content and variance of the energy content, as determined by said filter means, across all frequency cells in a signal sample, said processor means also deriving a comparison signal by comparing said mean energy content and variance of energy content in a signal sample, a comparison signal indicating an approximate equality and manifesting said sample as probable noise.

2. The signal detector as recited in claim 1, wherein said filter means performs a Fourier analysis upon each said signal sample to determine a magnitude of energy in each of a plurality of frequency cells in said signal sample.

3. The signal detector as recited in claim 1, wherein said mean energy content and variance of said energy content determined by said processor means, are based upon power content of each frequency cell.

4. The signal detector as recited in claim 1, wherein said processor means determines a ratio between mean energy content and variance of energy content across frequency cells to determine said comparison signal.

5. The signal detector as recited in claim 1 further comprising:

adaptive filter means for receiving said signal sample and removing slowly varying tones therefrom prior to feeding said signal sample to said filter means.

6. A signal detector for discriminating between signals manifesting noise and signals manifesting information appearing at an input, said signal detector comprising:

means for sampling said signals at said input;

filter means for determining for each signal sample, an energy content of each of a plurality of frequency cells in said signal sample; and processor means for determining a centroid center frequency across all frequency cells in a signal sample, said centroid center frequency being a frequency wherein approximately equal cumulative energy amounts reside in frequency cells in said signal sample on upper and lower frequency sides of said centroid center frequency, said processor means further determining if said centroid center frequency is substantially the same as the center frequency of all said frequency cells in said signal sample, and if so, manifesting a signal indicating a presence of probable noise.

7. The signal detector as recited in claim 6 wherein said centroid center frequency (cfc) is determined from the following expression:

$$cfc = \frac{\sum_{f=0}^{n} (f)(|X(f)|^2)}{\sum_{f=0}^{n} |X(f)|^2} \quad (D)$$

where
f = frequency of a Fourier Cell
$|X(f)|^2$ = Fourier cell magnitude
n = number of frequency cells in Sample.

8. The signal detector as recited in claim 6 wherein said processor means determines a bandwidth of all energy in said frequency cells in said signal sample, said determination employing said centroid center frequency determined for said signal sample, and then compares said bandwidth to the total frequency span of said frequency cells in said signal sample to determine a ratio therebetween, and if said ratio varies from a preset value, manifesting a signal indicating probable noise.

9. The signal detector as recited in claim 8 wherein said bandwidth is determined by said processor means through use of the following expression:

$$\text{Bandwidth} = \text{Square root} \left( \frac{\sum_{f=0}^{n} (f - cfc)^2(|X(f)|^2)}{\sum_{f=0}^{n} |X(f)|^2} \right)$$

where
f = center frequency of a Fourier cell
cfc = centroid center frequency of all frequency cells in the signal sample
$|X(f)|^2$ = Fourier cell magnitude
n = number of Fourier frequency cells per sample.

10. The signal detector as recited in claim 6 wherein said processor means determines a skew value of energy about said centroid center frequency that is indicative of its symmetry across said frequency cells of said signal sample, said processor means manifesting probable noise if said skew value is substantially a null.

11. The signal detector as recited in claim 10 wherein said skew value is determined from the following expression:

$$\text{Skew} = \text{Cube root} \left( \frac{\sum_{f=0}^{n} (f - cfc)^3(|X(f)|^2)}{\sum_{f=0}^{n} |X(f)|^2} \right)$$

where:
f = frequency of Fourier cell
$|X(f)|^2$ = Fourier cell magnitude
n = number of frequency cells in sample.

* * * * *